United States Patent [19]

Chiang et al.

[11] Patent Number: 5,361,229
[45] Date of Patent: Nov. 1, 1994

[54] PRECHARGING BITLINES FOR ROBUST READING OF LATCH DATA

[75] Inventors: David Chiang, Saratoga; Wei-Yi Ku, Cupertino, both of Calif.

[73] Assignee: Xilinx, Inc., San Jose, Calif.

[21] Appl. No.: 55,808

[22] Filed: Apr. 8, 1993

[51] Int. Cl.$^5$ .......................... G11C 8/00; G11C 7/00
[52] U.S. Cl. ..................... 365/189.05; 365/203; 365/189.01; 365/189.08
[58] Field of Search ............ 365/189.05, 203, 230.08, 365/202, 189.01, 154

[56] References Cited

U.S. PATENT DOCUMENTS 4,107,556  8/1978  Stewart et al. ................. 365/202
4,800,300  1/1989  Walters, Jr. .................... 307/279
4,820,937  4/1989  Hsieh ............................ 307/475

Primary Examiner—Eugene R. LaRoche
Assistant Examiner—Huan Hoang
Attorney, Agent, or Firm—Norman R. Klivans; Edel M. Young

[57] ABSTRACT

The bit line for reading data in or writing data out from a CMOS integrated circuit latch is precharged to the trip point voltage of the latch (as determined by the latch's transistor design) shortly before the occurrence of a read operation. The precharging circuitry uses the latch circuit itself to generate the trip point, hence ensuring that the precharging circuit operates properly with regards to the latch characteristics in spite of temperature, voltage and fabrication process variations. The precharging circuitry ensures that during the operation of reading data from the latch, the bit line voltage never causes the latch to completely switch states, since at most the bit line voltage asymptotically approaches the trip point voltage. The precharging circuit is relatively simple, including only two logic gates and three other transistors.

7 Claims, 3 Drawing Sheets

PRECHARGING BITLINES FOR ROBUST READING OF LATCH DATA

BACKGROUND OF THE INVENTION

1. Field of the Invention

This invention relates to the implementation of logic functions in an integrated circuit logic device, and more specifically to ensuring reliability of reading from and writing to a latch configuration data storage element.

2. Description of the Prior Art

Many complex integrated circuit chips require configuration information to be loaded after device reset or during normal operation to internally set up the proper state. To minimize the chip die area, this information is typically stored in latches that share common read/write lines ("bitlines"). A typical latch comprises two cross-coupled inverters (connected to form a loop), which holds a state until the state is overwritten in a write operation.

A prior art CMOS transistor latch circuit is shown in FIG. 1(a). To write data to a latch 5, write enable transistor 2 is turned on by an externally provided WRITE signal, enabling the inverting buffer 3 to provide the inverted DATAIN signal as a particular voltage (either Vcc or ground) to the bitline 1. Each inverter in FIG. 1(a) is (see FIG. 1(b)) conventionally a pair of CMOS transistors, one N-type "N" and the other P-type "P", with their gates connected to the inverter input and their drains commonly connected to the inverter output. Passgate 4 of FIG. 1(a) (shown as a single N-channel transistor, but which may alternatively be a CMOS transmission gate or a series of such structures) connects the latch 5 (including cross-coupled inverters 20, 22) to the bitline 1. Passgate 4 is turned on by a signal on line 8 in response to (1) the $\overline{\text{ENABLE}}$ signal provided to transistors 12 and 13 as driven by inverters 16, 18 and (2) the address of this latch, which results in the gate terminals of all transistors 10 being held low.

In a complex integrated circuit chip, there are typically several latches 5 connected to each bitline 1. For each latch 5 there is a corresponding line 8 controlling a passgate 4. Transistors 10 in FIG. 1 are addressed differently for the different passgates 4 connected to the same bitline 1, and select which of several configuration latches shall connect to bitline 1.

When transistor 4 is first turned on, there is momentary logic contention if latch 5 is switching states, but the transistor characteristics of latch 5 are such that the output of inverter 20 is overpowered, and the value of the data stored in latch 5 becomes the logical state of bitline 1. The small numbers adjacent to or over each schematic symbol in FIG. 1(a) denote the size of the active area (channel region) of the transistors. The single number denotes width of the transistor, with the transistor length being the minimum allowed by the fabrication technology (currently about 1.0 μm). Hence transistors 10 each have a channel width of 5 μm; inverter 3 includes a P-type transistor of 30 μm channel width and an N-type transistor of 20 μm channel width.

To read data from latch 5, bitline 1 is floating (i.e. not being driven by any signal), when connecting passgate 4 is turned on as described above. This allows latch 5 to charge the bitline 1 voltage to the voltage which is the stored internal state (data) of latch 5. Read enable transistor 6 is then turned on (turning off P-type transistor 11) by the READ signal. Bitline 1 voltage is then inverted by inverting buffer 7 and read out as the DATA-OUT signal.

Because of the capacitance of bitline 1, there is problematically a potential for "read disturb," whereby during a read operation, the latch data is lost when the latch 5 accidentally achieves the value of the floating bitline 1, which may have been left at high or low potential (different from that of latch 5) corresponding to the last voltage that was actively driven onto bitline 1.

To address the read disturb problem, a scheme for lowering the gate voltage of the passgate during a read operation while maintaining a full voltage during a write operation is disclosed in commonly assigned Hsieh, U.S. Pat. No. 4,820,937, [docket M-349] incorporated herein by reference. However, the circuit of Hsieh requires substantial complexity and hence expense.

SUMMARY OF THE INVENTION

In accordance with the invention, the latch bitline is precharged to the trip point voltage of the latch (using a circuit matched to the latch's transistor design) prior to the latch read operation. This eliminates read disturb and ensures accurate latch data reading and writing. The precharge circuit uses an inverter manufactured by the same process and having corresponding characteristics to the inverters in the latch circuit. This precharge inverter has its input and output shorted together to generate the trip point voltage, which is applied to the bitline before reading, hence ensuring accurate tracking of the precharge circuit to the latch characteristics over temperature, voltage, and semiconductor process. Bitline precharging in accordance with the invention works by making sure that during the latch read operation, the bitline voltage can never cause the latch to switch states, since the most the bitline voltage can do is cause the latch to asymptotically approach the trip point voltage.

DETAILED DESCRIPTION OF THE INVENTION

Figure 2:
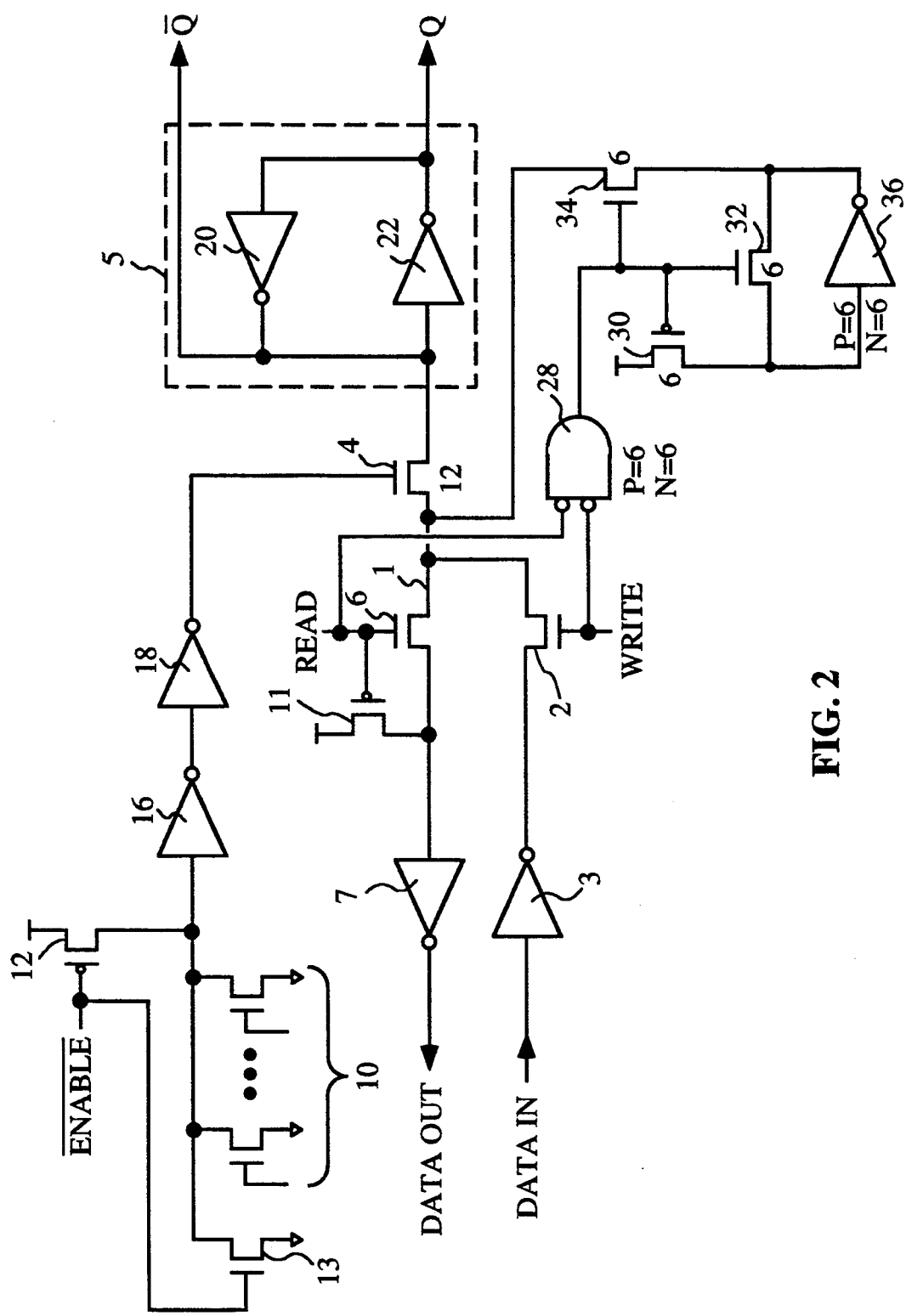
FIG. 2 is a latch circuit in accordance with the invention.

As shown in FIG. 2, to generate the trip point voltage, the precharge portion of the latch circuit in effect ties input and output of an inverter together to generate an intermediate voltage which is at the trip point voltage of the latch. Note that only the relative sizes and not the absolute sizes of the channel areas of the P-type and N-type transistors of the latch precharging circuit are important, hence any scaling of both the P-type and N-type transistor sizes may be used as long as the same scale factor is used for both P-type and N-type transistor sizes in the latch precharging circuit. By size is meant here the width W of the transistor channel region, given a uniform length L of the channel region, as determined by the dimensions of the transistor gate. It is well known that a CMOS transistor's drain current, gain, and operating speed are each proportional to the channel region aspect ratio W/L.

Figure 1A:
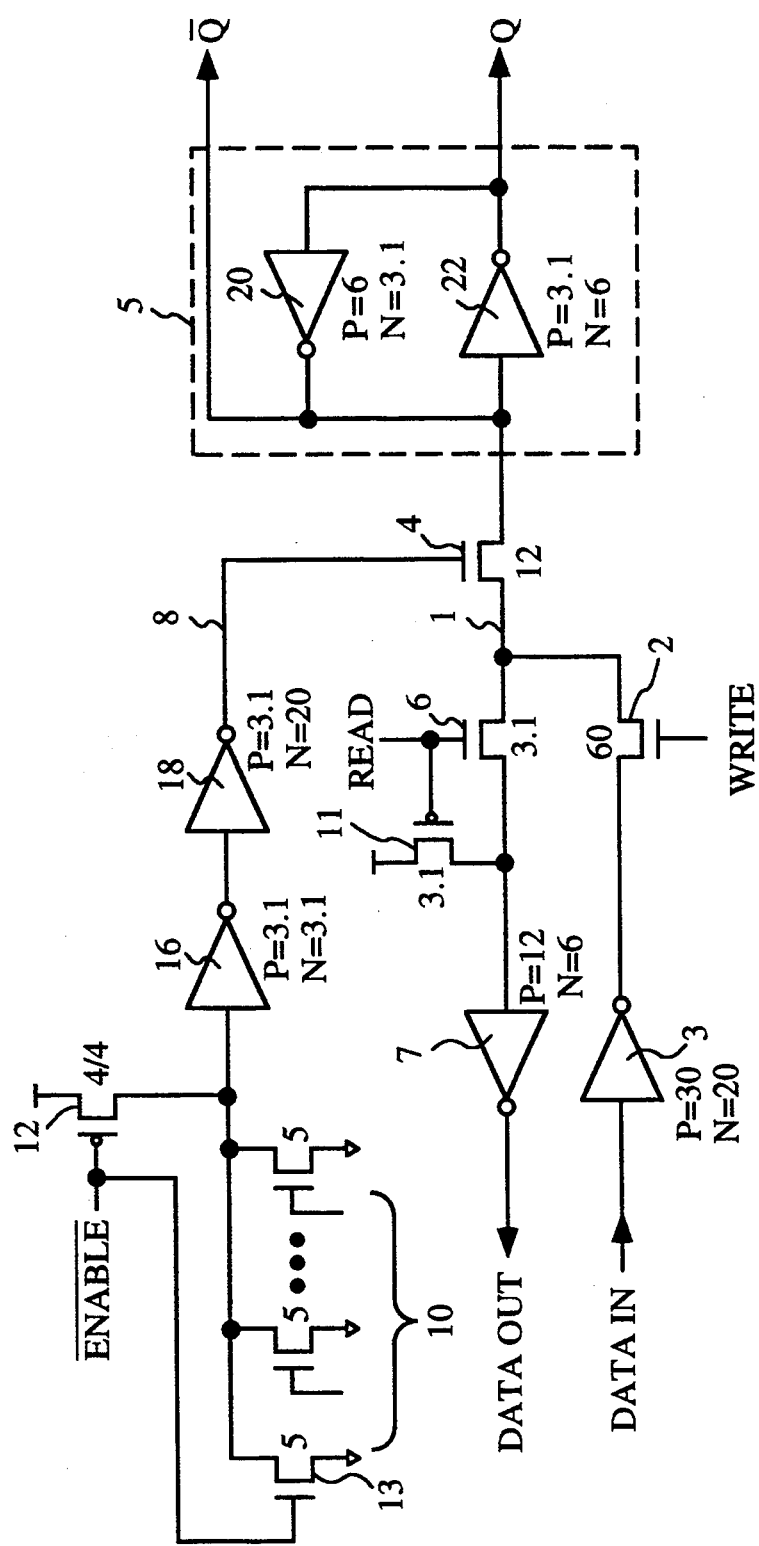
FIG. 1(a) is a prior art latch circuit.
Figure 1B:
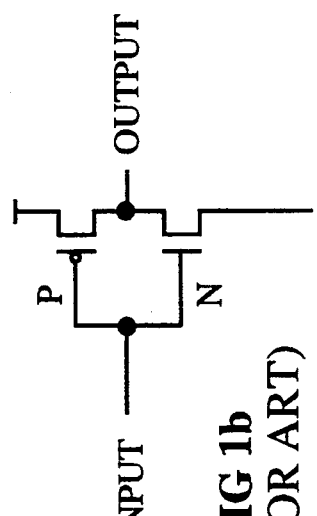
FIG. 1(b) is a prior art CMOS inverter.

Precharging in accordance with the invention for a latch circuit is shown in FIG. 2. The circuit elements in FIG. 2 are identical to the similarly numbered circuit elements of FIG. 1. The circuit of FIG. 2 additionally includes inverted input AND gate 28 (a NOR gate), P-type transistor 30, N-type transistor 34, N-type transistor 32, and inverter 36; all are conventional CMOS circuit elements and they provide the precharging feature. The widths in microns of the channel regions of the transistors of circuit elements 30, 32, 34, and 36 are shown using the same notation as in FIG. 1(a).

The trip point voltage of latch 5 is equal to the trip point voltage of a single inverter which is a circuit equivalent of latch 5, as described below with reference to FIG. 3(b). The need is to provide a particular voltage on bit line 1 so as to precharge latch 5 to the desired trip point voltage. The function of transistor 30 is that when the circuit is not in a precharge mode (so that gate 28 outputs a low signal) then transistor 30 is on to ensure that the input of inverter 36 is at a valid (high) voltage level. This prevents drawing of DC current in the non-precharge mode by the precharging circuitry.

In FIG. 2 the input terminals of AND gate 28 are connected respectively to the READ line and the WRITE line. The output signal of AND gate 28 controls respectively P-type transistor 30, N-type transistor 32, and N-type transistor 34. Only if N-type transistor 34 is on, i.e. the output of AND gate 28 is high, will the output signal of inverter 36 be provided to bit line 1. In this precharge mode, since transistor 30 is off and transistor 32 is on, the resulting voltage at the output of inverter 36 is the trip point voltage of inverter 36, since this is the voltage which is applied to the inverter input generates an output of the same voltage. The trip point voltage of inverter 36 is designed to be equal to the latch trip point voltage by making the length/width ratio of inverter 36 equal to the length/width ratio of transistors 20 and 22. This trip point voltage is passed to bit line 1 via transistor 34. Since AND gate 28 turns off transistor 34 during READ or WRITE, precharging only takes place if there is no read and no write of latch 5 taking place. This avoids precharging during a read or write operation.

The length and width of the channel regions of the P-type and N-type transistors in inverter 36 determine the pre-charge level, i.e. the voltage provided to put bit line 1 at the trip point voltage. As shown the P-type transistor in inverter 36 is 6 microns wide and the N-type transistor in inverter 36 is also 6 microns wide. Inverter 36 is therefore matched to (in terms of scaled channel region size) respectively the P-type transistors in inverters 20 and 22 and the N-type transistors in inverters 20 and 22 in latch 5.

Figure 3A:
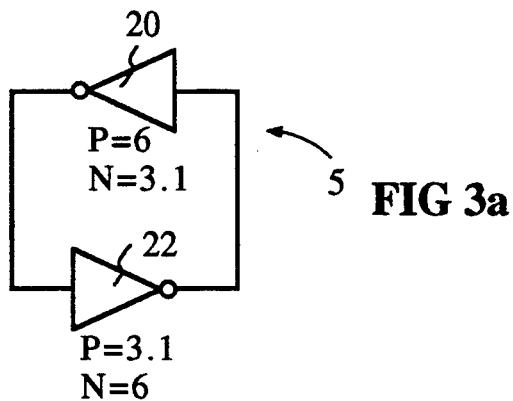
FIGS. 3(a), 3(b), 3(c) are equivalent circuits to portions of FIG. 2.

The scaled sizing of the P-type and N-type transistors in inverter 36 relative to the size of the transistors in inverters 20 and 22 is explained with reference to FIGS. 3(a), 3(b), and 3(c). FIG. 3(a) shows the inverters 20 and 22 of latch 5 with the channel region widths of the P- and N-type transistors as shown. The trip point of a latch is the voltage obtained by connecting the complementary sides together. For the latch of FIG. 3a, the trip point is the voltage of the connection line 40 shown in FIG. 3b.

Figure 3B:
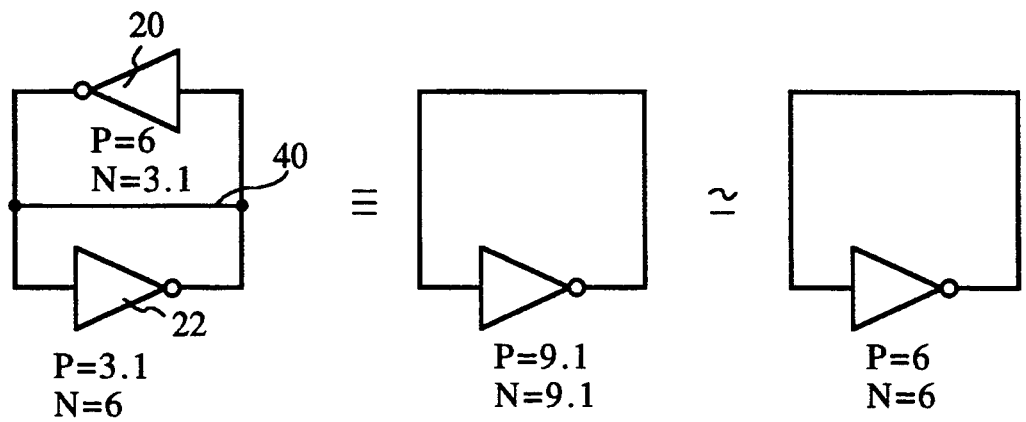

The equivalent of this circuit is shown in the middle portion of FIG. 3(b) as a single inverter having a single P-type transistor and a single N-type transistor, each of which is equal in size to the combined transistors of the same particular P or N type in both of inverters 20 and 22. Thus the middle portion of FIG. 3(b) shows an equivalent circuit to that of the left-most portion, during precharge. This is because the P-type transistors of each of the two latches 20 and 22 actually are shorted together electrically in this equivalent circuit. Transistor 32 of FIG. 2 provides this shorting by connecting the input terminal of inverter 36 to the output terminal of inverter 36 during precharging.

Then, as shown in the right-most portion of FIG. 3(b), it is the relative channel region size of the P-type to N-type transistors in this inverter which determines output voltage, rather than the absolute transistor size. Hence, the right-most portion of FIG. 3(b) is electrically equivalent in this case to the middle portion of FIG. 3(b).

Figure 3C:
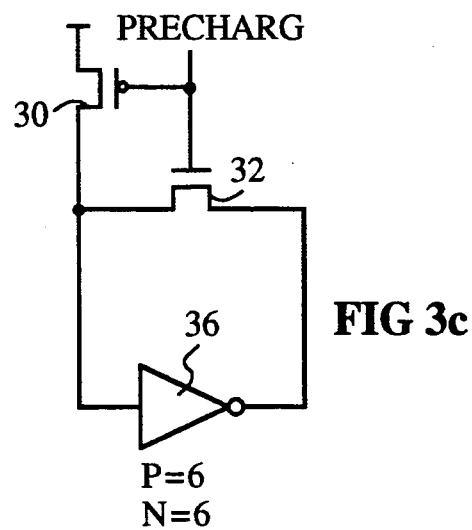

Hence, the pre-charge circuit of FIG. 2 (shown partially in FIG. 3(c)) including the control transistors 30 and 32 and inverter 36 as controlled by the precharge command from AND gate 28 (not shown), provides the trip point voltage to bitline 1 exactly at the needed voltage since inverter 36 is the electrical equivalent in this sense of latch 5.

It is to be understood that the above embodiment is in the context of a latch circuit for a programmable logic device where the configuration bits are stored in latches such as latch 5 of FIG. 2. During device power-up of such programmable logic devices the information, i.e. program information, needs to be provided reliably, typically from EPROMs or E$^2$PROMs (or other non-volatile memory elements) into the latches. That is done in the write cycle as explained above. Also, during testing of the chip after its fabrication, it is necessary to test the latches to see if the chip is operating correctly, i.e. not including any internal short circuits. It is thus necessary to load information from an external source through a chip pin into the latches to be sure that the latches are operating properly. It is also necessary to test the reading out of information from the latches. Thus, this precharging circuit is of most use during testing following circuit fabrication, since reading of the latch through the DATAOUT line is done at this time. The precharge circuit herein is not limited in applications to programmable logic circuits or to CMOS circuitry, but is suitable for general use in any circuit including a latch that is written and read via a common line.

This disclosure is illustrative and not limiting; further modifications will be apparent to those skilled in the art. For example, an even lower-power embodiment replaces AND gate 28 of FIG. 2 with a 3-input AND gate having a third input which maintains a low output signal from AND gate 28 except directly before a read operation, so that CMOS inverter 36 is in a non-power-consuming state except for a brief period. In a simpler and higher power mode, transistors 30 and 32 are omitted, maintaining transistor 36 always at its trip point. Such additional embodiments are intended to fall within the scope of the appended claims.

We claim:

1. A data storage circuit comprising:
   a latch;
   a write circuit for writing data into said latch on a conductor connected to said latch;
   a read circuit for reading the data from said conductor; and
   a precharge circuit connected to said conductor for charging said conductor to a trip point voltage of said latch.

2. The circuit of claim 1, wherein said precharge circuit includes a logic gate operatively connected to said read circuits and said write circuit, thereby allowing the charging of said conductor only when no writing or reading of the data is occurring.

3. The circuit of claim 1, wherein said precharge circuit includes a buffer having two field effect transistors each having an active area differing from and having a predetermined relation to the active area of transistors in said latch.

4. The circuit of claim 3, further comprising a switch for connecting an input terminal of said buffer to an output terminal thereof during the charging.

5. A method of operating a latch for storing data written into said latch on a line connecting to said latch and which is to be read out of the latch on the line, comprising:
- generating a voltage at a trip point of said latch;
- determining a time when no reading or writing of the data is taking place; and
- at the determined time, connecting the generated voltage to said line, thereby charging said line.

6. The method of claim 5, wherein said precharge circuit includes a buffer, and further comprising the step of:
- at the determined time, connecting an output terminal of said buffer to an input terminal thereof.

7. The circuit of claim 1, wherein said precharge circuit includes:
- a buffer having an input terminal and an output terminal;
- a first transistor connected between said input and output terminals of said buffer and having a gate terminal;
- a second transistor connected between a voltage source and said input terminal of said buffer and having a gate terminal;
- a third transistor connected between said output terminal of the buffer and said conductor and having a gate terminal; and
- a logic gate having two input terminals connected respectively to said read circuit and said write circuit, and having an output terminal connected to the gate terminals of said first, second, and third transistors.

* * * * *